3,454,376
Patented July 8, 1969

3,454,376

METAL COMPOSITE AND METHOD OF MAKING SAME

Betty M. Luce and Betty L. Berdan, Willowick, Ohio, assignors to Clevite Corporation, a corporation of Ohio No Drawing. Continuation-in-part of application Ser. No. 555,250, June 6, 1966. This application Dec. 11, 1967, Ser. No. 689,248
Int. Cl. C23b 5/18, 5/08; C23h 5/32
U.S. Cl. 29—194 16 Claims

ABSTRACT OF THE DISCLOSURE

There is provided a metal composite and method of making same characterized by a nickel or copper substrate and an electroformed nickeliferous coating adhered thereto, said coating being formed from a solution of a soluble nickel salt and a soluble ammonium salt under stated conditions of temperature, current density and time.

This application is a continuation-in-part of our copending application Ser. No. 555,250 filed June 6, 1966, now abandoned.

Briefly, this invention contemplates an electrochemically treated metal foil sheet or article to yield a metal composite including a metal substrate, e.g., nickel or copper, or alloys thereof, and an adherent electrocathodically formed nickeliferous coating thereon to produce a nickel-nickeliferous coating composite, or a copper-nickeliferous coating composite, for example, characterized by improved adhesion to a resinous substrate, and a method for electrochemically treating metal foil sheets or articles to improve adhesion to resinous substrates. In general, the improved metal foil, sheets, or articles are produced by and the method of this invention carried out by submitting the foil, sheet, or article to electrochemical action at a predetermined current density at a predetermined temperature, i.e., about room temperature (70° F.), and for a period of time sufficient to deposit upon the surface thereof an adherent nickeliferous coating from a nickel ion-containing and conducting medium characterized by the presence therein of ammonium ion. The resultant product has a grayish suede-like or matte appearance. The ion-containing and conducting medium is preferably acidic but has been operated successfully at a pH in the range from 1.0 to 9.0.

The invention is particularly useful in the field of printed circuits, and particularly printed circuits which in normal use are submitted to temperatures which approach or exceed the melting of ordinary solder as is commonly used with printed circuits. As is known in the art, printed circuit boards are of laminar structure including a resinous substrate, for example, a fiber reinforced epoxy resin, an adhesive layer, or "sticker sheet," and a foil layer formed or formable (as by etching) to a predetermined electrical circuit. The aforementioned layers are pressed together at high pressure, for example, 1300 p.s.i. and at a temperature sufficient to soften the "sticker sheet," e.g. about 300° F.

While nickel foil has been used prior to this time in printed circuitry, the temperature sensitivity of the adhesive and/or the plastic backing sheet has generally made such printed circuits unsatisfactory for high temperature applications. The epoxy resins are able to withstand elevated temperatures much better than, for example, the polyvinyl chloride resins, and are, therefore, desired for such high temperature applications. However, the adhesion of nickel to this adhesive is not satisfactory, and it is to the solution of this problem that the present invention is primarily directed. With copper foil, which has also been used extensively in printed circuitry, higher strength can be obtained with welded connections than with soldered connections, especially under high vibration conditions. Again, temperature sensitivity is a problem in view of the higher temperatures in forming the connections.

Any nickel, nickel alloy, copper, or copper alloy surface may be improved in respect of its adhesion to resinous substrates, and particularly glass fiber reinforced epoxy resins, in accordance with this invention. However, for best results, we prefer to utilize electroformed nickel or copper foil having a thickness of from one to five mils. Rolled foil, i.e., foil produced by rolling a nickel or copper billet, may also be used, but better results are obtained with this material if it is preliminarily etched to remove the worked surface. The mode of producing electroformed nickel or copper foil or rolled nickel or copper foil are each well known in the art and need not be detailed herein. As obtained commercially, these foils are generally 1 to 3 mils thick. It is preferred that the metal surface to be treated in accordance herewith shall be clean, and this can normally be achieved by a water rinse. If the metal to be treated in accordance herewith has been exposed to organic matter, or contains residual soil, for example, it should be degreased prior to treatment in accordance herewith. Best results are obtained with a freshly electrodeposited foil which is physically and chemically clean as results from a clean water rinse following the electroformation thereof. Cleaning may be effected electrolytically, or mechanically, such as by the use of very finely divided magnesium oxide.

Clean nickel foil, or copper foil, for example, is then introduced into an electrochemical treating cell wherein it is adapted to be rendered electronegative with respect to a relatively electropositive electrode which is preferably a nonconsumable electrode, e.g., a platinized titanium anode. Carbon may also be used. Any nonconsumable electron conductor may be used. The electrodes of the cell are disposed in confronting, preferably parallel, relation and are so sized and configured that the distance between the electrode is substantially the same at all points. The foil may be continuously supplied to the cell and bath from a supply roll at a rate such that the area of exposure and exposure time are equivalent to those obtained in a static system.

The external circuit of the cell includes any suitable source of direct current, for example, a battery, or a D.C. generator.

The spacing between the electrodes is somewhat critical, although spacing and time are related, one being directly proportional to the other. In other words, the greater the spacing between the electrode, the greater the time of exposure at a given current density in order to achieve the desired result. The optimum spacing of the electrodes is in the range of from 1 to 3 inches and it has been found that a preferred distance is from 1.5 to 2.5 inches in a static bath. The electrodes are desirably of like size and configuration, and are maintained in substantially parallel relationship for the greatest uniformity of treatment of the nickel surface. If the article is cylindrical and treated in accordance herewith, a concentrically disposed annular nonconsumable anode is employed. A suitable voltage for the external circuit is 6 volts.

The internal circuit of the cell is composed of the inert nonconsumable anode and the nickel or copper cathode, and the respective interfaces between the electrodes and an ion-containing and conducting medium which is disposed therebetween. The ion-conducting medium for most purposes, is ordinary tap water or preferably, demineralized water. Means for providing a supply of nickel ions in the ion-containing and conducting medium are also provided, and preferably in the form of a water soluble salt of nickel. Suitable materials include nickel chloride ($6H_2O$), nickel sulfate (hexahydrate), nickel ammonium sulfate, nickel acetate, nickel formate, and nickel sulfamate. Also included in the ion-conntaining and conducting medium is a solution-soluble ammonium ion source, such as ammonium sulphate, ammonium chloride, ammonium acetate or ammonium bromide which is soluble in the solution and does not precipitate nickel. The remaining ammonium halides are not satisfactory for the purposes of the present invention. The ion-containing and conducting medium may be used until the nickel concentration falls below the point where good results are obtained, i.e., below about 3 grams per liter. The spent medium may be restrengthened with nickel and reused, and may, if desired, be utilized as a continuously circulating system. Good results are obtained when the source of the nickel ion and the source of the ammonium ion have a common anion.

The concentration of nickel in the ion-containing and conducting medium should be in the range of from 3.5 to 25 grams of nickel per liter, calculated as the metal. This amounts to from about 15 to about 100 grams per liter of nickel chloride as the hexahydrate. The concentration of the ammonium ion should be in the range of from 20 grams per liter as a minimum up to the maximum limit of solubility of ammonium salt in the ion-containing and conducting medium. Normally from 80 to 120 grams per liter of the ammonium chloride will be satisfactory. A stoichiometrically equivalent amount of the bromide or other solution-soluble ammonium salt may be used in place of the chloride.

The primary electrochemical reaction is carried out for a period of time which, as indicated above, is in the range of from 15 seconds to 3 minutes in duration. The temperature of the ion-containing and conducting medium may range from just above the freezing temperature of the solution to about 30° C. and is preferably at about room temperature; if necessary, cooling means are provided to maintain the temperature at about 21° C. or slightly below. Higher current densities are desirable at the lower temperatures, i.e. 150 to 300 amps per square foot at 10° C. A plate which is not desired for adhesion purposes is obtained at temperatures elevated above about room temperature. The pH of the solution is within the range of from 1.0 to 9.0 and preferably from 2.0 to 6.0 and the current density at which the electrochemical treatment of the surface is carried out is desirably in the range of from 50 to 300 amperes per square foot. When nickel chloride hexahydrate is used as the source of the nickel ion, the preferred pH of the ion-containing and conducting medium will be approximately 6. With a nickel sulfate as the source of the nickel ion, the pH will generally be between 2 and 3.

In carrying out the method of the present invention, it is not desired to obtain a smooth or sound nickel metal plate on the electroformed nickel or copper surface. The conditions which are employed in carrying out the present method constitute a departure from normal nickel plating procedures. For good or sound nickel plating purposes, the pH used herein is too high, the concentration of the metal ion is too low, and the temperature of the plating bath is also too low. The current density employed at the nickel concentration in the ion-containing and conducting medium is abnormal, and the concentration of the ammonium ion in the solution is most unusual. Likewise, it is not desired to produce on the other end of the operating range, a powdery, easily removable deposit on the surface of the metal being treated. The finish which is obtained in a properly treated surface in accordance with this invention is suede-like, and the coating which is applied is strongly bonded to the nickel or copper surface. If the time of the exposure is too long, or the current density is too high, or there is no ammonium ion present, then the result is not satisfactory for the purposes of this invention. If the temperature is increased too much, then a sound or smooth metal plate is secured. If the nickel concentration is too high, then a smooth metal plate is secured. Within the limits stated herein and in keeping with the relationships among the parameters as stated, desired results are secured.

It is not completely understood what transpires at the interface between the nickel or copper cathode and the ion-containing and conducting medium, and the composition of the electrocathodically formed nickeliferous coating is not known. It is believed that the pH change which occurs at the interface between the cathode and the nickel ion-containing and conducting medium affects the deposition of nickel metal, possibly including or occluding nickel oxide, or hydroxide because of a relatively high pH. This coating is defined herein as a "nickeliferous" coating. On treating the metal surface in accordance with this invention, the surface area is increased. Moreover, the nature of the deposit seems to be especially well adapted to coact with a resinous substrate, such as an epoxy resin to improve chemical adhesion. Thus, the surface produced on the nickel or copper sulbstrate being of increased area and rough character to give the suede-like appearance improved adhesion to the "sticker sheet," and there also appears to be an enhancement of chemical adhesion. It is believed that this surface is a result of lowering the cathode current efficiency from that which is normally required to plate good sound nickel on a nickel or a copper substrate.

After the electrochemical treatment of the nickel surface is completed, the nickel foil, sheet or article is rinsed, and may desirably be given an aqueous chromic acid dip. The latter contains chromic acid at a concentration of from 0.15 to 0.5 gram per liter of chromic acid, e.g., 0.25 gram per liter.

When nickel or copper foil which has been treated in accordance herewith is laminated with an epoxy resin through an intermediate "sticker sheet," it is now possible to obtain adhesions of the order of from 3 to 16 pounds per inch for chromate dipped products, as determined by the standard N.E.M.A. procedure for determining bond strengths of laminated metallic foils on non-metallic substrates.

The manner in which the bond strength measurements are made is as follows: a six-inch square of nickel foil from 1 to 3 mils thick, for example, treated in accordance with this invention is submitted to a six-inch square of epoxy resin and allowed to harden under the influence of heat (302° F.) and a pressure of approximately 1300 p.s.i. Score lines one inch apart are struck across the surface pentrating through the nickel foil. The edge of the one-inch strip of nickel foil is turned back by stripping from the surface a short distance, and clamped in a tensiometer. The tensiometer is so adapted and constructed as to exert a steady pull at right angles to the surface of the metal foil-resin laminate providing a continuous reading in terms of pounds of pull per inch of width.

Electroformed nickel foil or rolled nickel foil when tested in the manner aforesaid exhibits substantially no adhesion to the resinous substrate. However, when such foils are treated in accordance with the present invention, adhesions in the range of from 3 to 16 pounds per inch on the same substrate are obtained.

The following specific examples will serve to illustrate a preferred manner of making the coated nickel articles of the present invention and carrying out the method hereof:

| Treatment | Bond-pounds per inch (to G–10 Epoxy glass)[1] |
|---|---|
| As-plated | Nil |
| As-plated, 15 sec. chromate dip | 1.6–2.8 |
| (1) Nickel chloride hexahydrate, 50 grams/liter; ammonium chloride, 100 grams/liter: pH 6.0. Current density, 100 a.s.f. (amperes per square foot). Time, 1 minute—15 sec. chromate dip 0.25 grams/liter | 13.6–15.0<br>11.0–11.4<br>14.0–15.4<br>11.6–12.8<br>12.0–12.6 |
| Current density 150 a.s.f. Time, 15 seconds—15 sec. chromate dip | 15.0–16.0<br>12.2–13.2 |
| (2) Nickel chloride hexahydrate, 50 grams/liter; ammonium chloride, 100 grams/liter: pH 6.0. Current density, 100 a.s.f. Time, 1 minute—15 sec. chromate dip | 10.0–11.2<br>9.6–10.2<br>12.8–13.8 |
| Current density, 150 a.s.f | 13.4–14.0 |
| Time, 15 seconds | 10.6–11.8 |
| (3) Nickel sulfate, 25 grams/liter; ammonium chloride, 100 grams/liter: pH 2.2–2.5. Current density, 100 a.s.f. Time, 1 minute—15 sec. chromate dip | 12.0–12.6<br>9.8–11.2<br>11.4–12.4 |
| Current density, 150 a.s.f. Time, 15 seconds—15 sec. chromate dip | 9.0–10.4 |
| (4) Nickel ammonium sulfate, 50 grams/liter; ammonium chloride, 100 grams/liter: pH 3.5. | |
| Current density, 100 a.s.f.—(1) no chromate dip | 8.0–9.0 |
| Time, 1 min. (2) 15 sec. chromate dip | 9.6–11.2 |
| Current density, 150 a.s.f.—(1) no chromate dip | 5.0–6.6 |
| 15 sec. (2) 15 sec. chromate dip | 7.6–9.0 |
| (5) Nickel ammonium sulfate, 25 grams/liter; ammonium chloride, 100 grams/liter: pH 3.5. | |
| Current density, 50 a.s.f. 2 min.—15 sec. chromate dip | 11.0–11.4 |
| Current density, 100 a.s.f. 1 min.—15 sec. chromate dip | 7.6–8.8 |
| Current density, 150 a.s.f. 15 sec.—15 sec. chromate dip | 6.6–7.4 |
| (6) Nickel chloride hexahydrate, 50 grams/liter; ammonium chloride, 100 grams/liter: pH 1.0 (with HCl). Current density, 100 a.s.f. Time, 1 minute—no chromate dip | 6.5–7.0 |
| (7) Nickel chloride hexahydrate, 50 grams/liter; ammonium chloride, 100 grams/liter: pH 7.1 (with $NH_4OH$). Current density, 100 a.s.f. Time, 1 minute—no chromate dip | 6.0–6.5 |
| (8) Nickel chloride hexahydrate, 50 grams/liter; ammonium chloride, 100 grams/liter: pH 8.0 ($NH_4OH$). Current density 200 a.s.f. Time, 1 minute—no chromate dip | 0.8–1.2 |
| (9) Nickel chloride hexahydrate, 50 grams/liter; ammonium chloride, 100 grams/liter: pH 8.0 ($NH_4OH$). Current density, 300 a.s.f. Time, 1 minute—no chromate dip | 3.0–3.6 |
| (10) Nickel chloride hexahydrate, 50 grams/liter; ammonium chloride, 100 grams/liter: pH 9.0 ($NH_4OH$). Current density, 300 a.s.f. Time, 1 minute—no chromate dip | 3.4–3.8 |
| (11) Nickel acetate, 40 grams/liter; ammonium acetate, 150 grams/liter: pH 6.0. Temperature, 15° C. Current density, 100 a.s.f. Time, 1 minute—chromate dip | 12.8–13.4 |
| (12) Nickel chloride hexahydrate, 50 grams/liter; ammonium acetate, 150 grams/liter: pH 6.0. Temperature, 21° C. Current density, 100 a.s.f. Time, 1 minute—chromate dip | 12.8–13.0 |
| (13) Nickel chloride hexahydrate, 100 grams/liter; ammonium chloride, 100 grams/liter: pH 6.0. Temperature, 21° C. Current density, 200 a.s.f. Time, 1 minute—chromate dip | 9.0–9.4 |
| (14) Nickel chloride hexahydrate, 50 grams/liter; ammonium chloride, 100 grams/liter: pH 6.0. Temperature, 20° C. Current density, 100 a.s.f.—chromate dip | 10.8–11.0 |
| (15) Nickel chloride hexahydrate, 50 grams/liter; ammonium chloride, 100 grams/liter: pH 6.0. Temperature, 30° C. Current density, 100 a.s.f.—chromate dip | 14.6–15.0 |
| (16) Nickel chloride hexahydrate, 50 grams/liter; ammonium chloride, 100 grams/liter: pH 6.0. Temperature, 13° C. Current density, 100 a.s.f.—chromate dip | 12.4–12.8 |
| (17) Nickel chloride hexahydrate, 50 grams/liter; ammonium chloride, 100 grams/liter: pH 6.0. Temperature 10° C. Current density, 200 a.s.f.—chromate dip | 12.6–13.0 |

1 Glass fiber reinforced epoxy resin, commercial grade used for printed circuits.

It has also been found that, following the desposition of a nickeliferous coating on a nickel or copper substrate, the deposition of a coating of nickel metal over the nodularized surface resulting from the treatment above described to anchor the nickeliferous projections improves the strength of such projections for better handling characteristics of the foil, sheet, or article. Solutions and conditions for accomplishing the anchoring operation include conventional sound nickel metal plating baths, plating conditions, and plating apparatus.

| Treatment | Bond-pounds per inch (to G–10 Epoxy glass)[1] |
|---|---|
| (18) Nickel chloride hexahydrate, 50 grams/liter; ammonium chloride, 100 grams/liter: pH 6.0 ($NH_4OH$). Current density, 200 a.s.f. Time—1 minute | (1) |
| Plating conditions now changed to: Current density, 50 a.s.f. Time, 30 seconds—no chromate dip | 10.0–13.2 |
| (19) Nickel sulphate hexahydrate, 50 grams/liter; ammonium sulphate, 50 grams/liter: pH 6.0. Current density, 200 a.s.f. Time, 30 seconds. Treated foil rinsed and overplated under following conditions (normal Ni plating conditions): Nickel sulphate hexahydrate, 120 grams/liter; ammonium chloride, 15 grams/liter: Boric acid, 15 grams/liter. pH 3.0–3.5. Current density, 20 a.s.f. Time, 4 minutes—chromate dip | 10.0–11.0 |
| (20) Conditions of Example 19 repeated in entirety except final overplate time was 2.0 minutes instead of 4 minutes—chromate dip | 9.5–10.5 |

1 Powder obtained.

Examples 1 to 20 are treatments on nickel foil 2 mils thick. The same aqueous solutions and conditions may be used in depositing a nickeliferous coating on copper. Examples 11–17 shows the effect of temperature; Examples 1–10 have been run at room temperature; i.e., 21° C. The same chromate bath composition has been used for 15 seconds except where noted.

Thus, there has been described a nickel or copper foil, sheet, or article which, by virtue of electrochemical surface treatment under conditions which are antithetical to the production of a sound nickel plate, show vastly improved adhesion characteristics to reinous substrates, and particularly with respect to epoxy resinous substrates. There has also been provided a method for electrochemically treating the surface of electroformed nickel or copper foil, rolled nickel or copper foil, nickel or copper sheets or coiled electroformed or rolled nickel or copper, or nickel or copper articles to develop or enhance such adhesion charcateristics, in an electrochemical apparatus including an ion-containing and conducting medium disposed between a pair of spaced electrodes, the more electronegative of which is the nickel or copper surface being treated, and the more electropositive of which is preferably a nonconsumable electrode, said ion-containing and conducting medium including ionic nickel derived from a nickel salt soluble in the medium and ammonium chloride.

What is claimed is:

1. A metallic composite comprising a nickel or copper metal substrate and an electrocathodically formed nickeliferous coating adhered thereto, said coating having a suede-like appearance and formed by electrolytically reducing onto said substrate nickel from an aqueous solution of from 3.5 to 25 grams of nickel per liter of solution derived from a water soluble nickel salt, and from 20 grams per liter of solution to the limit of solubility in said solution of ammonium ion, said solution having a pH of from about 1 to 9, at a temperature in the range of from just above the freezing temperature of the solution to 30° C. at a current density of from 50 to 300 ampers per square foot for a period of from about 0.2 minute to about 3 minutes.

2. A nickel composite in accordance with claim 1 in which the nickel substrate is electroformed nickel foil.

3. A composite in accordance with claim 2 in which the coating is adhered to the as plated surface of said electroformed nickel foil substrate.

4. The method for electrocathodically treating a metal surface to improve its adhesion to a resinous substrate which comprises the steps of:

(a) disposing said metal surface in substantially uniformly spaced confronting relation to an anode;

(b) disposing between and in interface-forming relation with said metal surface and said anode, an internal circuit forming aqueous ion-containing and conducting medium including from 3.5 to 15 grams per liter of solution of nickel derived from a nickel salt soluble in said solution, and from 20 grams per liter of solution to the limit of solubility in said solution of ammonium ion, said medium having a pH of from about 1 to 9;

(c) rendering said metal surface electronegative relative to said anode; and (d) passing an electric current through the internal circuit at a current density of from 50 to 300 amperes per square foot for a period of time of from 0.2 to 3 minutes at a temperature from just above the freezing point of the aqueous medium to about 75° F. to deposit a nickeliferous coating on said metal surface.

5. A method in accordance with claim 4 wherein the metal surface is spaced from said anode from 1.0 to 3.0 inches.

6. A method in accordance with claim 4 wherein said metal surface is nickel foil.

7. A method in accordance with claim 4 wherein said metal surface is copper foil.

8. A method in accordance with claim 10 wherein said foil is continuously moved relative to said anode.

9. A method in accordance with claim 7 wherein said foil is fed past said anode from a supply roll.

10. A method in accordance with claim 4 wherein said anode is a nonconsumable electrode.

11. A method in accordance with claim 10 wherein said electrode is a platinized titanium anode.

12. A method in accordance with claim 4 wherein the nickel salt is nickel chloride hexahydrate.

13. A method in accordance with claim 4 additionally characterized by the step of dipping the electrocathodically treated nickel surface in an aqueous bath containing chromic acid at a concentration of from 0.15 to 0.5 grams per liter.

14. An ion-containing and conducting medium having a pH of from 1 to 9 and useful in forming an electrocathodically deposited nickeliferous coating on a nickel metal surface consisting essentially of:

(a) from 10 to 15 grams of nickel per liter of ion-containing and conducting medium, said nickel being derived from a nickel salt soluble in said medium;

(b) from 20 grams of ammonium ion per liter of ion-containing and conducting medium to the limit of solubility in said medium; and (c) water to make a liter of medium.

15. An ion-containing and conducting medium in accordance with claim 14 in which the nickel salt is nickel chloride hexahydrate.

16. A method in accordance with claim 4 which is additionally characterized by the step of anchoring the nickeliferous coating with a coating of nickel metal.

References Cited

UNITED STATES PATENTS

| | | | |
|---|---|---|---|
| 765,371 | 7/1904 | Aylsworth | 204—49 |
| 2,331,751 | 10/1943 | Wesley | 204—49 |
| 2,625,507 | 1/1953 | Mayper | 204—49 |
| 2,844,530 | 7/1958 | Wesley et al. | 204—49 |

FOREIGN PATENTS

| | | |
|---|---|---|
| 464,814 | 4/1937 | Great Britain. |

JOHN H. MACK, *Primary Examiner.*

T. TUFARIELLO, *Assistant Examiner.*

U.S. Cl. X.R.

29—199; 204—27, 28, 49